United States Patent [19]

Takagi et al.

[11] Patent Number: 5,055,780
[45] Date of Patent: Oct. 8, 1991

[54] PROBE PLATE USED FOR TESTING A SEMICONDUCTOR DEVICE, AND A TEST APPARATUS THEREFOR

[75] Inventors: Ryouichi Takagi; Tetsuo Tada; Masanobu Kohara, all of Hyogo, Japan

[73] Assignee: Mitsubishi Denki Kabushiki Kaisha, Tokyo, Japan

[21] Appl. No.: 474,609

[22] Filed: Feb. 5, 1990

[30] Foreign Application Priority Data

Mar. 9, 1989 [JP] Japan ..................... 1-56718

[51] Int. Cl.$^5$ ............................................. G01R 1/02
[52] U.S. Cl. ............................. 324/158 F; 324/72.5; 324/158 P
[58] Field of Search ................ 324/72.5, 158 F, 158 P

[56] References Cited

U.S. PATENT DOCUMENTS

| | | | |
|---|---|---|---|
| 4,647,851 | 3/1987 | Dugan | 324/72.5 |
| 4,719,417 | 1/1988 | Evans | 324/72.5 |
| 4,780,836 | 10/1988 | Miyazaki et al. | 324/158 F |
| 4,912,399 | 3/1990 | Greub et al. | 324/158 F |
| 4,912,401 | 3/1990 | Nady, II et al. | 324/158 F |
| 4,922,192 | 5/1990 | Gross et al. | 324/158 F |

FOREIGN PATENT DOCUMENTS

| | | | |
|---|---|---|---|
| 59-171131 | 9/1984 | Japan . | |
| 61-179747 | 11/1986 | Japan . | |
| 0058650 | 3/1987 | Japan | 324/158 P |
| 63-152243 | 10/1988 | Japan . | |
| 0252437 | 10/1988 | Japan | 324/158 P |

OTHER PUBLICATIONS

"Flexible Contact Probe", by Greene et al., IBM Tech. Disc. Bull., vol. 15, #5, 10/72, p. 1513.

C. Barsotti et al., "Very High Density Probing," *1988 International Test Conference* Paper 30.2, 4/88, pp. 608-614.

B. Leslie et al., "Membrane Probe Card Technology (The Future for High Performance Wafer Test)", *1988 International Test Conference* Paper 30.1, 4/88, pp. 601-607.

*Primary Examiner*—Kenneth A. Wieder
*Assistant Examiner*—William J. Burns
*Attorney, Agent, or Firm*—Lowe, Price, LeBlanc and Becker

[57] ABSTRACT

A test apparatus for a semiconductor device is provided to be used for testing, wafer by wafer, a semiconductor device formed on a semiconductor wafer. The test apparatus for a semiconductor device comprises a test head, a probe card and a selection circuit. The probe card has an insulating transparent base plate, and protruding parts are formed on the main surface of the base plate corresponding to electrode pads on a test object semiconductor wafer, and conductive layer forming a prober for the electrode pad is formed on the surface of each of these protruding parts. A wiring layer is formed on the surface opposite to the main surface. The wiring layer and the probers are connected electrically through the through holes provided on the base plate. A prober to be connected to the test head is switched electrically, which makes it possible to test a semiconductor device without moving the corresponding semiconductor wafer.

7 Claims, 8 Drawing Sheets

PROBE PLATE USED FOR TESTING A SEMICONDUCTOR DEVICE, AND A TEST APPARATUS THEREFOR

BACKGROUND OF THE INVENTION

1. Field of the Invention

The present invention relates to a probe plate used for a test of a semiconductor device, and it relates especially to a probe plate used for testing, wafer by wafer, the characteristic of a semiconductor device formed on a semiconductor wafer. The present invention also relates to a semiconductor test apparatus and a semiconductor test method using the probe plate as mentioned in the above.

2. Description of the Background Art

In general, in the process of manufacturing a semiconductor integrated circuit device (IC), the electric characteristics of a semiconductor device formed on a semiconductor wafer are measured with a test apparatus called a wafer prober for an IC test.

FIGS. 10A to 10C are perspective views showing known wafer prober as background art of the present invention in a disassembled state for clarity: FIG. 10A shows a test head, FIG. 10B shows a probe card and FIG. 10C shows part of a wafer; FIG. 11 is a perspective view showing the external appearance of a probe card seen from the bottom; FIG. 12 is a partly enlarged perspective view showing a state where a thin conductor needle (hereinafter referred to as a probe needle) is in touch with an electrode pad on a wafer; FIG. 13 is a cross-sectional view showing a state where a wafer prober is being used. In the following, the constitution of a wafer prober will be described referring to FIG. 10A to FIG. 13.

Referring to FIGS. 10A to 10C, a wafer 3 is marked off into a plurality of semiconductor chips 33 with scribe lines 32 provided on the wafer main surface 31. On each of these semiconductor chips 33 a semiconductor device such as an LSI (large scale integration) is made, and surrounding the semiconductor device many electrode pads 34 are provided for power supply and for input/output of signals.

In the examples shown in FIGS. 10A to 10C, to be able to test two pieces of chips as a unit, a plurality of thin probe needles 21 are provided on the probe card 2 so that they can face individual electrode pads on two pieces of semiconductor chips. The probe needles 21 are made of tungsten, chromium or an alloy of tungsten and chromium, and they are fixed on a surface of the probe card 2, made of an insulating material, with ring members 22 made of resin as shown in FIG. 11. The probe needles 21 are connected electrically with solder 24, etc., to a metallic pattern wiring 23 on the surface of the probe card 2.

The contact area of a probe needle 21 with the surface of an electrode pad 34 is about 50 to 100 $\mu m\phi$. An external diameter of a probe needle 21 on the side to be connected to a probe card 2 is about 200 to 300 $\mu m\phi$. The metallic pattern wiring 23 formed on the probe card 2 is electrically connected through through holes 25 to a metallic pattern wiring 26 formed on the surface opposite to the surface on which probe needles are connected. The metallic pattern wiring 26 is electrically connected to a metallic film part 27 having comparatively large area provided on the opposite side surface.

In the FIG. 10B are shown through holes, metallic pattern wiring 26 and metallic film parts 27 respectively, but actually each set of these parts is provided for each of the probe needles. There is provided an opening part 28 on the probe card 2 to visually confirm if probe needles 21 are making contact with electrode pads 34.

A test head 1 is a head of a test apparatus (hereinafter referred to as an IC tester) for judging the quality of an LSI by a functional operation test checking whether a logic circuit comprising an LSI, etc., operates properly, or by a DC test checking whether the logic circuit maintain a normal output voltage when it is loaded with a specified load. Pogo-pins 12 are provided to face metal film parts 27 on the probe card 2 around the opening part 11 on the test head 1. In FIG. 10A, several pogo-pins are shown for simplification. A pogo-pin gives a test signal to an LSI and receives a signal from the LSI.

Referring to FIG. 13, a wafer 3 is placed and fixed on a wafer chuck 4; the chuck 4 is held movably with a moving mechanism 5 in three directions which make a right angle with each other; the probe card 2 is fixed on a fixing part 6 of a wafer prober. A pogo-pin 12 of the test head 1 is pressed and abutted against a metal film part 27 on the probe card 2.

The procedure of a test of electric characteristics of a semiconductor device in the state of a wafer by using a wafer prober as mentioned in the above will be described in the following.

The electrode pads 34 on any two semiconductor chips 33 and the probe needles 21 fixed on the probe card 2 are aligned to be opposed and abutted with each other by using the moving mechanism 5. The probe needles 21 are made to make contact with the surfaces of electrode pads 34 by the movement of the wafer chuck 4 in the direction of an arrow mark A shown in FIG. 13.

The waveform of a signal to be given to an LSI is formed in the test head 1 and output from a pogo-pin 12. Because a pogo-pin is pressed and abutted against a metallic film part 27 on the probe card 2, the signal from the test head 1 is transmitted to the probe needles 21 soldered to a pattern wiring 23 through the metallic pattern wiring 26 extended from the metallic film part 27, a through hole 25 and the metallic pattern wiring 23, and the signal is applied to the LSI in the semiconductor chip 33 from the electrode pad 34. An output signal from the LSI is given to the test head 1 through the route in the reverse direction to the above, and it is given to an IC tester (not shown in the drawing) from the test head 1. The test of electric characteristics of an LSI is executed as described in the above.

As mentioned in the above, a wafer prober with which the electric characteristics of a plurality of semiconductor chips can be measured simultaneously has been known. The number of semiconductor chips which can be measured simultaneously is, however, limited by the following factors: an opening part 28 is needed for the visual confirmation of the contact between a probe needle 21 and an electrode pad 34, so that the probe needles 21 have to be disposed around the opening part 28; the outer diameter of a probe needles 21 on the side to be connected to the probe card 2 is large; and a certain area is needed to solder the probe needles 21 to the pattern wiring 23. Therefore, the number of semiconductor chips which can be measured simultaneously is limited to 2 or 3 pieces.

A test method for a semiconductor integrated circuit with which all the chips on a wafer can be measured without moving the wafer is disclosed in Japanese Patent Laid-Open No. 59-171131. In this application, the description as shown in the following is given: a base plate provided with a plurality of probe needles which is movable upward and downward selectively in a matrix form is placed over a semiconductor wafer on which a plurality of semiconductor integrated circuits are formed, and the desired probe needles are selectively moved upward and downward with a control system to touch the pads of semiconductor integrated circuits for measuring electric characteristics of the semiconductor integrated circuits.

In this test method, probe needles are depressed down with an air driving force, and when the air driving force is removed they are returned with spring forces. Therefore, when a desired needles is selected, it is necessary to depress down the desired needle with the air driving force and make the other needles return with the spring forces. In this test method, a probe needle is mechanically moved by an air driving force, so that it is a problem that a selecting action is slow.

A mechanism for moving a needle upward and downward has to be provided in the neighborhood of the needle, which limits the miniaturization of a device, and so it is difficult to apply this method to a device having small sized or small pitched pads.

When the size of an electrode pad is miniaturized to the order of 100 $\mu m \times 50$ $\mu m$ and the pitch becomes less than 80 $\mu m$, it becomes impossible to make a needle touch an electrode pad. When the size or pitch of an electrode pad to be made on a wafer is, the miniaturization the outer diameter of a probe needle must be miniaturized. When the outer diameter of a probe needles is miniaturized, however, the strength of the needle is weakened and also its manufacture becomes difficult, and further there is a problem that the mounting of the needle onto the probe card becomes difficult.

To solve the increasing difficulties in the manufacturing process in proportion to the miniaturization of a chip, a probe card in which a bump-shaped conductive prober is used in place of a probe needle is described in a Japanese Utility Model Laid Open No. 61-179747. FIG. 14 shows a cross-sectional view of such a conductive prober. Referring to FIG. 14, on a flexible insulating substrate 41 a through hole 42 is formed, and to the through hole 42 the plating 43 is given. On the plating 43 surrounding the through hole 42 a bump-shaped conductive prober is formed by dropping solder.

When the above-mentioned conductive prober is used, assembling work is facilitated comparing to the case of a probe needle 21. The bump-shaped conductive prober is, however, formed by dropping solder hence it is difficult to form the prober with high precision.

SUMMARY OF THE INVENTION

An object of the present invention is to provide a probe plate to be used for testing, a semiconductor device formed on a semiconductor wafer.

A further object of the present invention is to provide a probe plate which can be aligned with high precision to an electrode pad formed with fine processing on a semiconductor wafer.

A still further object of the present invention is to provide a test apparatus for a semiconductor device for testing a semiconductor device formed on a semiconductor wafer.

Another object of the present invention is to provide a semiconductor test method for testing a semiconductor device formed on a semiconductor wafer.

According to the present invention, a probe plate to be used for the test of a semiconductor device formed on a semiconductor wafer comprises an electrically insulating base plate. The base plate has protruding parts corresponding to electrode pads which serve as the test objects of a semiconductor wafer. A through hole is provided near the protruding part of the base plate. A conductive layer is formed on the surface of the protruding part as a conduct part with an electrode pad. A wiring layer is formed on the opposite surface to the main surface of the base plate. The wiring layer is electrically connected to the conductive layer formed as the contact part with an electrode pad through the through hole.

In another aspect of the present invention, the base plate of a probe plate is transparent.

In a further aspect of the present invention, the parts on the base plate are formed by selectively removing the parts which do not correspond to electrode pads by using the technique of photolithography and etching.

In a still further aspect of the present invention, the protruding part on a base plate is formed to be higher than the height of an electrode pad on a semiconductor wafer.

In another aspect of the present invention, a connecting conductive layer is formed on the main surface of a base plate for connecting conductive layers formed as the contact parts with the electrode pads of a semiconductor device on a semiconductor wafer and conductive layers formed as the contact parts with the electrode pads of another semiconductor device.

According to the present invention, a test apparatus for a semiconductor device for testing, a semiconductor device formed on a semiconductor wafer comprises a tester, a probe plate having probers, and a switching means. The switching means is electrically connected to the tester and to each of these probers, and electrically changes over a prober to be connected to the tester.

In another aspect of the present invention, a switching means is able to connect a prober corresponding to an electrode pad of a semiconductor device on a semiconductor wafer and a prober corresponding to an electrode pad of another semiconductor device.

A test method for a semiconductor device according to the present invention comprises a step in which a probe plate, on which probers are disposed corresponding to electrode pads which are the test objects of a semiconductor wafer, is set on a test object semiconductor wafer so that the electrode pads and the probers can be electrically made to make contact with each other; and a step in which a prober to be connected to the tester is selected by a switching means which is electrically connected to the tester and to each of these probers and a semiconductor wafer is tested with a tester.

In the present invention, contact parts protruding from a base plate surface are formed on the insulating base plate corresponding to the measurement object electrodes on a semiconductor wafer. The conductive layer parts of the contact parts are made to be capable of making electrical contact with the electrodes; thereby a semiconductor wafer can be measured by the wafer unit without making the semiconductor wafer make a parallel movement.

For the selection of an electrode to be measured, an electrical switching means is provided for connecting any of the contact parts to the tester. Since the switching speed is high, the test time can be shortened.

Because of the transparency of the base plate, it is possible to visually confirm the contact condition and the alignment condition between the contact parts and the electrodes on a wafer.

The protruding parts of the base plate are not formed with the conductive layers but formed on the insulating base plate by using the technique of photolithography and etching. The protruding parts can be formed on the base plate at a high density with minute intervals corresponding to the minutely formed electrodes of a semiconductor device.

Moreover, the protruding parts and conductive layers can be formed with a cheap insulating material with the photolithography and etching technique, so that a cheap precise probe card can be obtained which corresponds to a freely designed pad layout.

BRIEF DESCRIPTION OF THE DRAWINGS

FIG. 1A shows a test head, FIG. 1B shows a probe card and FIG. 1C shows a wafer.

DESCRIPTION OF THE PREFERRED EMBODIMENTS

The structure of a wafer prober according to a preferred embodiment of the present invention will be described in the following, with reference to FIG. 1 to FIG. 5.

Figure 1A:
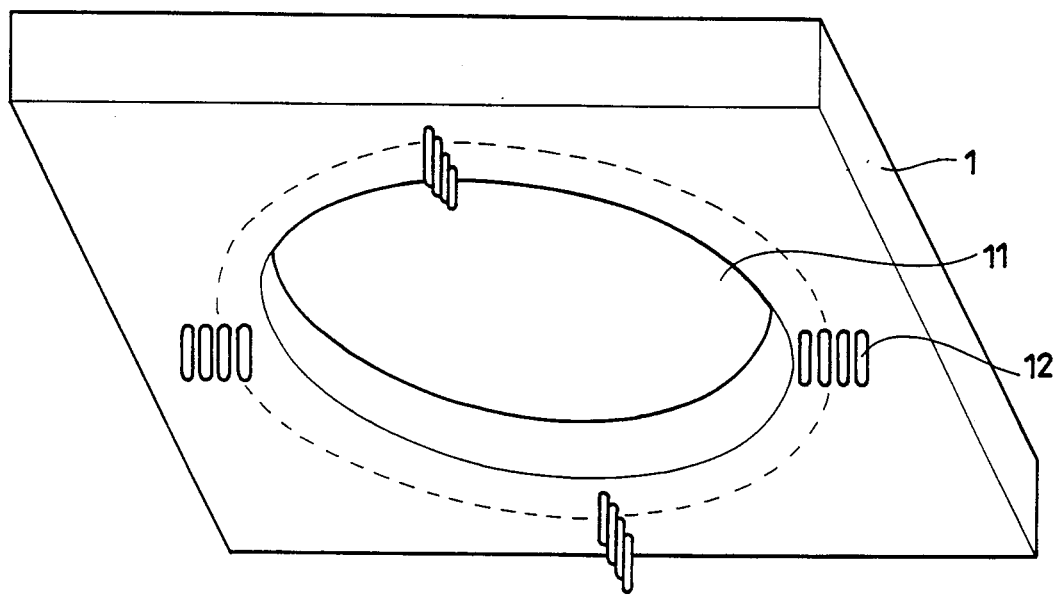
FIG. 1A to FIG. 1C are perspective views of a wafer prober disassembled for clarity of an embodiment according to the present invention.

A test head 1 is a head of an IC tester for judging the quality of the functional operation of a semiconductor chip 33 formed on a wafer 3, and it makes up the waveform of a signal to be applied to a semiconductor chip 33 and outputs it from pogo pins 12 and it receives a signal from the semiconductor chip 33 through the pogo pins 12. As shown in FIG. 1A pogo pins make up a set with 4 pins or 8 pins and hundreds of them are disposed in a radial disposition about the center of the opening part 11 and also along the periphery of the opening 11. Four sets of 4 pogo pins are shown in FIG. 1A for simplification. Among a plurality of pogo pins, at least one pogo pin is used for supplying a signal (hereinafter referred to as a chip selection signal) for selecting a semiconductor chip 33 on the wafer 3 to a probe card 2. The remainder are used for power supply or input/output of test signals. It is preferable that the size of the opening 11 be larger than the size of wafer 3 to facilitate the alignment operation.

Figure 5:
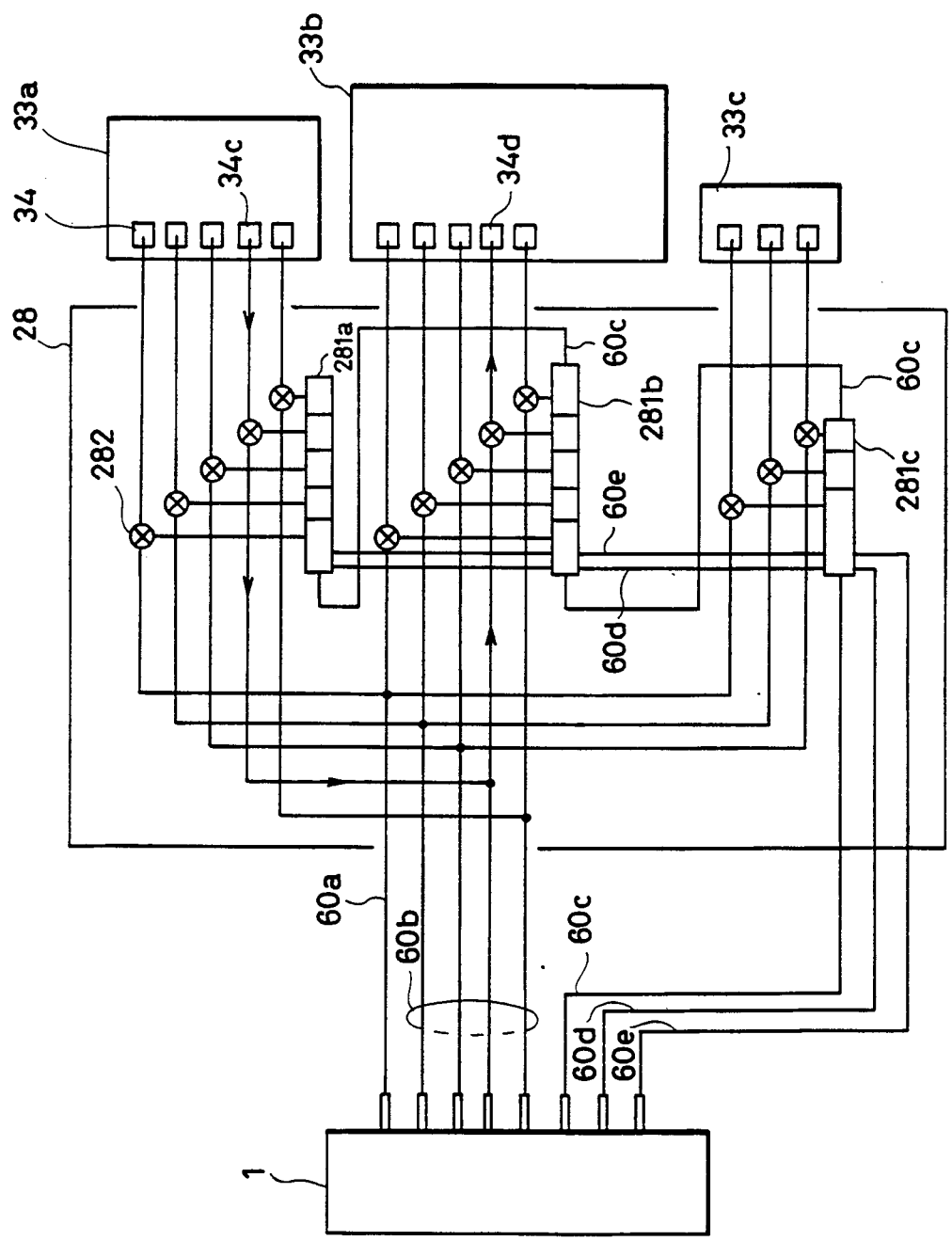
FIG. 5 is a simplified block diagram showing an electrical constitution of a wafer prober.

A probe card 2 is made of a transparent or translucent electrically insulating material. Glass or ceramic is conveniently used as a material for such a purpose. Owing to the usage of a transparent or translucent material, even if there is no opening part on the probe card 2, the contact state between a prober on a probe card and an electrode pad on a wafer and the alignment state by using a position mark 35 on the wafer 3 can be visually confirmed. A number of metallic film part 27 are formed on the probe card 2: corresponding to each set of pogo pins of the test head 1. Each metallic film part 27 is divided into 4 parts: 271, 272, 273 and 274, these being insulated with each other corresponding to each set of 4 pogo pins. A selection circuit 28 is provided and is electrically connected to each of the metallic film parts 27 through a metallic pattern wiring 26. The selection circuit 28, which will be explained later in detail in FIG. 5, is the circuit for selecting an electrode pad to be measured out of a plurality of electrode pads 34 provided on the wafer 3 based on a signal input from the test head 1 through a pogo pin 12, the metallic film part 27 and the metallic pattern wiring 26.

The above-mentioned chip selection signal is not necessarily supplied from the test head 1. When the chip selection signal is not supplied from the test head 1, it is supplied, for example, from an external device 7 to the selection circuit 28.

Figure 1B:
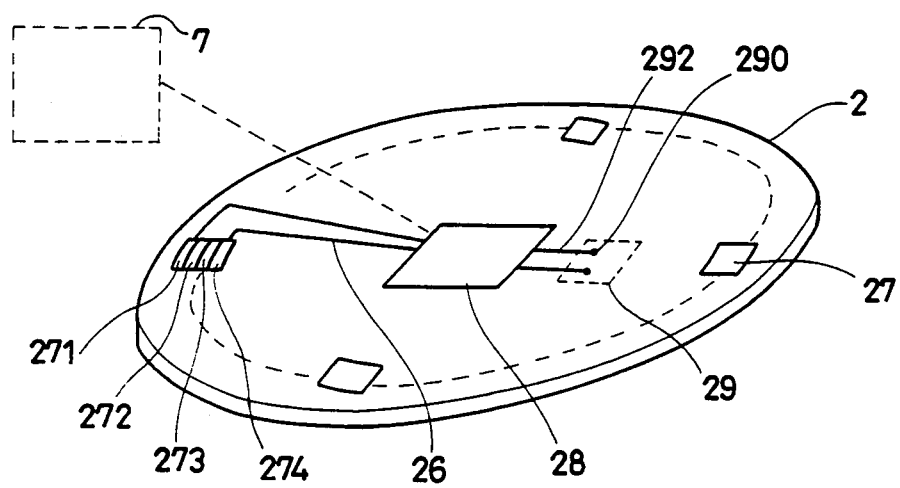
Figure 1C:
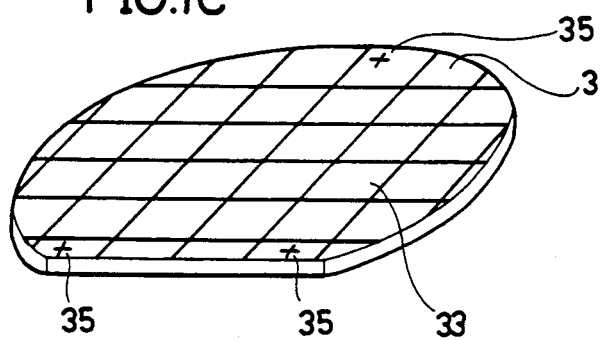
Figure 2:
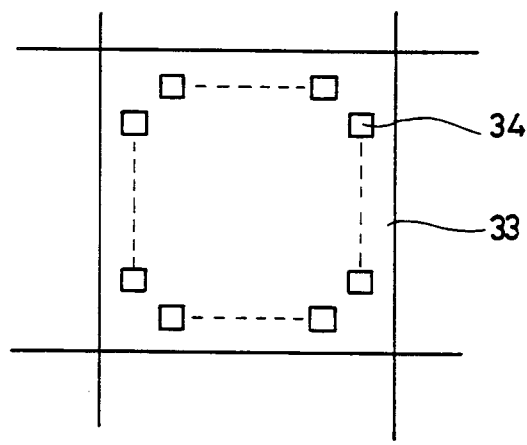
FIG. 2 shows an electrode pad of a semiconductor chip provided on a wafer.
Figure 3:
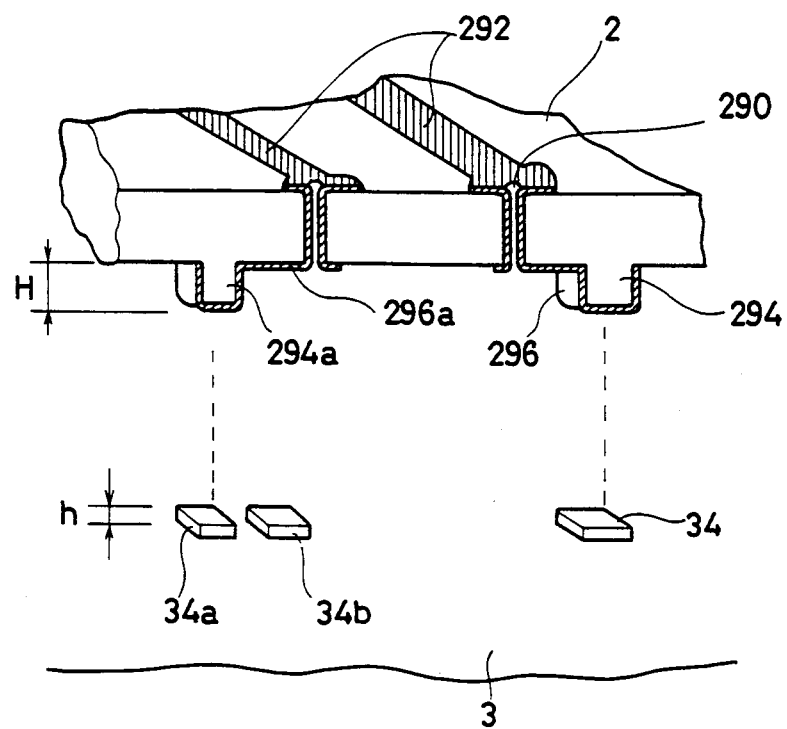
FIG. 3 is a partly enlarged perspective view showing a condition in which probers on a probe card are going to touch electrode pads.

A plurality of through holes 290 are provided in each region 29 of the probe card 2 corresponding to each of the semiconductor chips 33 on the wafer 3. In FIG. 1B, only one region 29 is shown for simplification. A prober 294 is provided as shown in FIG. 3 in the vicinity of a through hole 290 on the opposite surface to the surface on which the selection circuit 28 is provided. Each of the probers 294 is formed to face each of the electrode pads 34 in the semiconductor chip 33 shown in FIG. 2, when the probe card 2 is aligned in a specified position on the wafer 3. As shown in FIG. 3, the surface of prober 294 is covered with a metallic film 296 and it is arranged to make contact electrically with an electrode pad 34. The metallic film 296 is electrically connected to a metallic pattern wiring 292 extending form the selection circuit 28 through a through hole 290.

The center intervals (pitch or center distances) of the probers 294 are of the order of 80 $\mu$m and the size of the contact surface between a prober 294 and an electrode pad 34 is of the order of 50 $\mu$m $\times$ 50 $\mu$m. These dimensions are set corresponding to the sizes and the pitch of electrode pads provided in the test object semiconductor chip 33. In this manner, probers can be formed with such minute dimensions and at such a minute pitch as mentioned in the above that the probers exhibit efficacy for the wafer test of an LSI having the pads of minute dimensions, a minute pitch or a lot of pins.

As shown in FIG. 3, since a prober 294a is protruded from the surface of a probe card 2, and when an electrode pad 34b which is not the object of a test resides in the vicinity of an electrode pad 34a which is the object of a test, a metallic film part 296a formed on the flat surface of the probe card 2 does not make contact with the electrode pad 34b. The height H shown in FIG. 3 is made to be larger than the height of an electrode pad h (about 20 μm), and the H is in the order of 50 to 100 μm.

Figure 4:
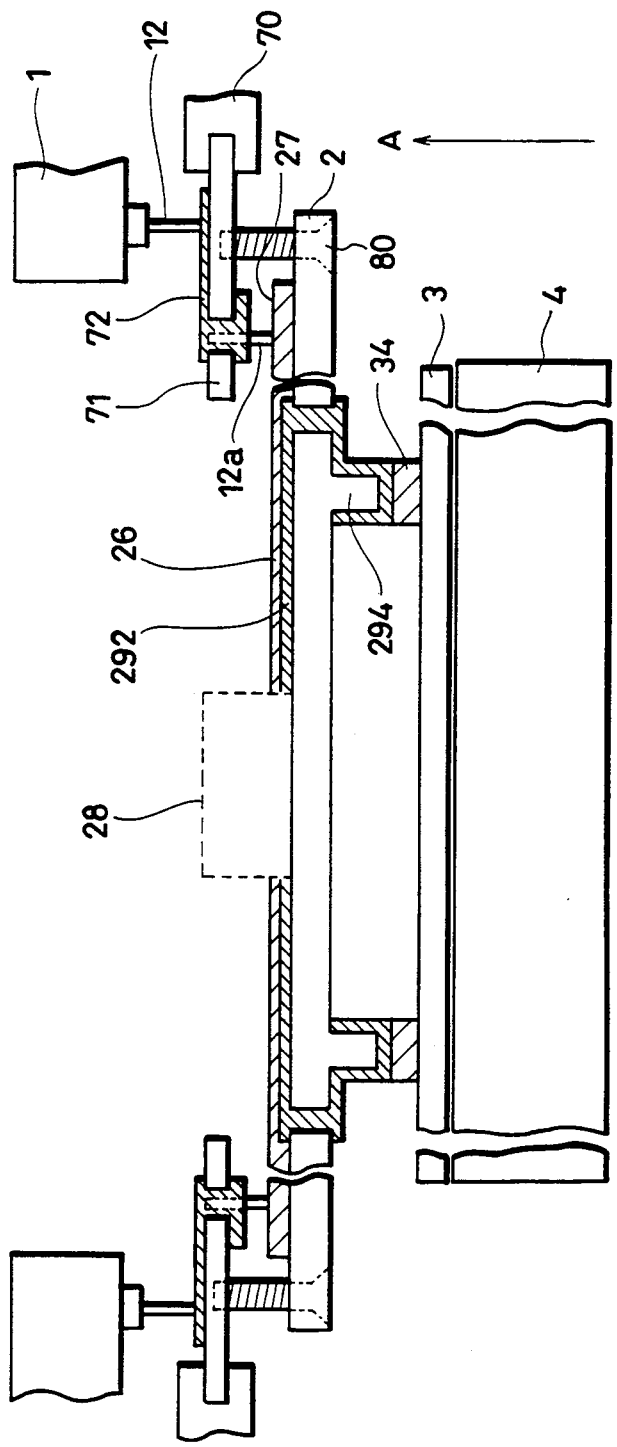
FIG. 4 is a cross-sectional view showing a using condition of a wafer prober.

Referring to FIG. 4, a wafer 3 on which a plurality of LSI's are formed is placed and fixed on a wafer chuck 4. The wafer chuck 4 is made to be movable at least in the direction of an arrow mark A. The probers according to the present invention can perform their function wafer by wafer, so that there is no need that the wafer chuck 4 can be moved so much as in above-described case, but for the purpose of alignment it is also made possible to move the chuck on a plane perpendicular to the direction of the arrow mark A. The alignment between the electrode pads 34 provided in the wafer 3 and the probers 294 on the probe card 2 is performed with the movement of the wafer chuck 4. Since a probe card is formed of a transparent or translucent material, the alignment can be easily performed.

The probe card 2 is fixed on an attachment board 71 with screws 80, which is set up on a probe supporting body 70. A metallic pattern wiring 292 formed on probe card 2 and extended from a prober 294 which abuts an electrode pad 34 is connected to the selection circuit 28. A metallic film part 27 which is electrically connected to the metallic pattern wiring 26 extended from the selection circuit 28 is connected electrically to a pogo pin 12a. The pogo pin 12a is connected to a metallic wiring layer 72 formed on an attachment board 71. The metallic wiring layer 72 is connected electrically to pogo pins 12 provided on the test head 1.

In FIG. 4, it should be noted that in the inside area of a break line the dimensions in the longitudinal direction are enlarged relative to those in the outside area, and the selection circuit 28 is too large to draw with the enlarged dimension, so that it is simply notionally shown.

The electrical constitution of a wafer prober constituted as mentioned in the above will be described in detail referring to FIG. 5. FIG. 5 shows a case where 3 pieces of semiconductor chips 33a to 33c are made to be a test object for simplification.

Referring to FIG. 5, the test head 1 is connected to the selection circuit 28 through a power supply line 60a, a signal line 60b, a chip selection signal line 60c, and clock signal lines 60d and 60e. The power supply line 60a is used for supplying power. The signal line 60b is used for transmitting a test signal to be given to the semiconductor chips 33a to 33c an a test result signal output from the semiconductor chips 33a to 33c. The chip selection signal line 60c is used for transmitting a chip selection signal. The clock signal lines 60d and 60e are used for transmitting two-phase clock signals.

In the selection circuit 28, there are provided shift registers 281a to 281c corresponding to individual semiconductor chips and also there is provided a relay 282 corresponding to each electrode pad. The shift registers 281a to 281c are for storing the chip selection signal and are operated based on the two-phase clock signals. In order to supply a chip selection signal to each of these shift registers, each of these shift registers 281a to 281c is connected with each other through the signal line 60c. The relay 282 is for making or breaking the circuit between the power supply line 60a and the electrode pads 34 or between the signal line 60b and the electrode pads 34, corresponding to each of the bits of shift registers. The relay 282 is, for example, constituted with a field effect transistor (FET). Since an FET operates at a high speed, a high speed selecting action can be obtained.

The operation of a wafer prober in a test mode will be described in the following.

A chip selection signal is given to the chip selection circuit 28 through the chip selection signal line 60c from the test head 1. The chip selection signal is constituted with a bit string, and the bit length of the signal is equal to the sum of the bit strings of shift registers or longer than that. In the example shown in FIG. 5, the bit string comprises 13 bits. In the bit string, first 5 bits are stored in the shift register 281a and the next 5 bits are stored in the shift register 281b and the remaining 3 bits are stored in the shift register 281c. When a bit is, for example, "0", it shows that a circuit is to be broken with a corresponding relay 282, and when it is "1" it shows that the circuit is to be made. Thereby when a chip selection signal having a bit string in which only the bit for a test object electrode pad is "1" is given to the selection circuit 28 from the test head 1, the circuit is so made that a signal from the test head 1 can be transmitted to the test object electrode pad 34.

From the test head 1, power or a signal for a test are given to an electrode pad 34 through the power supply line 60a or through the signal line 60b. At this time, power or a signal is given only to the electrode pad to which a circuit is made with the relay 282. A test result signal is output from the electrode pad 34 and is given to the test head 1 through the power supply line 60a or the signal line 60b. The test of an LSI formed on a semiconductor chip 33 is performed in the way as described in the above.

It is possible to test an organic function of LSIs in connecting electrically an LSI on a semiconductor chip 33a and another LSI on a semiconductor chip 33b by selecting an electrode pad 34c on the semiconductor chip 33a and an electrode pad 34d on the semiconductor chip 33b with a chip selection signal. For example, it may be needed in the case where an LSI on the semiconductor chip 33a is a CPU and another LSI on the semiconductor chip 33b is a memory. It is possible to test a plurality of semiconductor chips simultaneously, to test semiconductor chips one by one by switching, or to test a combination of semiconductor chips synthetically with the selection circuit 28. A latch circuit can be used in place of a shift register.

The selection circuit 28 can be formed by patterning a metallic film and an insulating film on a glass substrate etc., so that it can be cheaply mass-produced and also it is easy to handle because of its small size and light weight.

Figure 6:
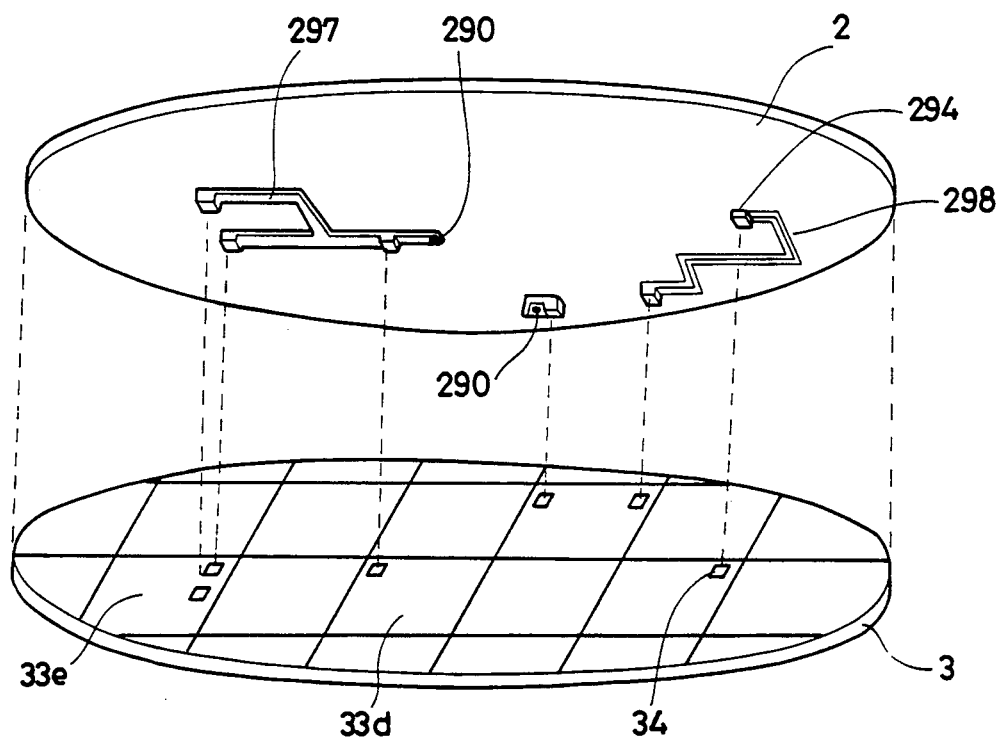
FIG. 6, FIG. 7 and FIG. 8 are drawings for showing examples of variations of a probe card.
Figure 7:
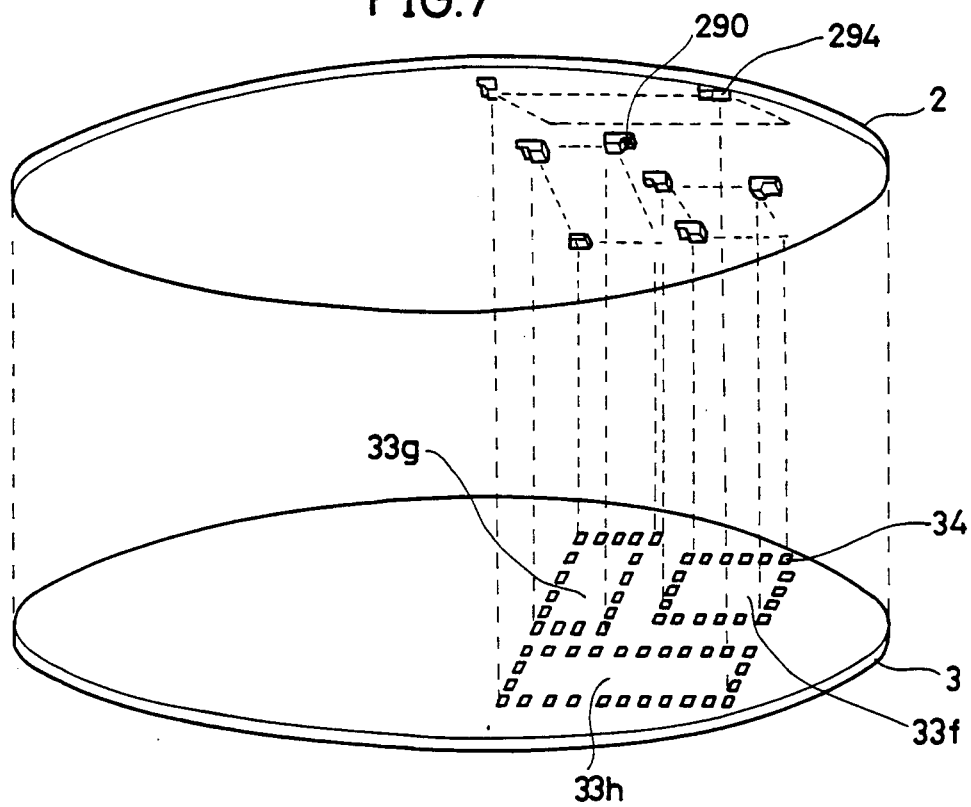
Figure 8:
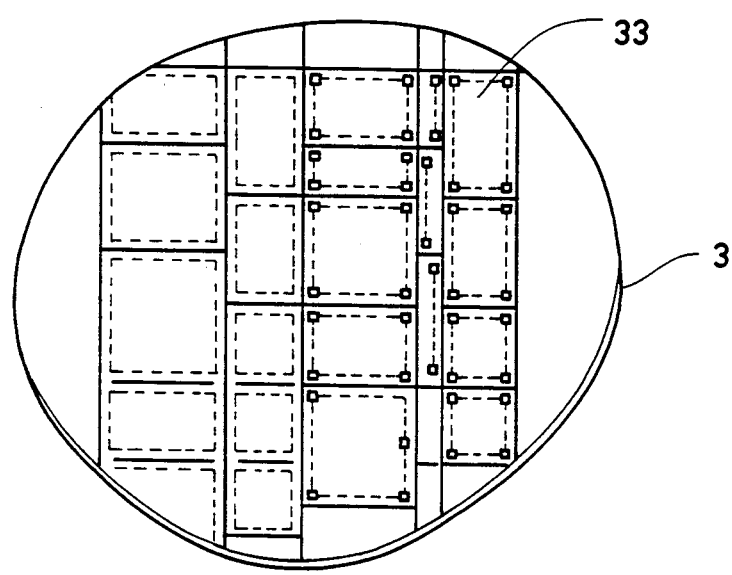

FIG. 6, FIG. 7 and FIG. 8 are illustrative drawings for explaining the variations of probe cards. Referring to FIG. 6, the probe card 2 has a function to be able to electrically connect semiconductor chips on a wafer; an output signal of a semiconductor chip 33d can be input to another semiconductor chip 33e with a metallic pattern wiring 297 provided on the probe card 2; the metallic pattern wiring 297 shows an example which has a branch on the way, and the metallic pattern 298 is an example which has no branch.

Referring to FIG. 7, the probe card 2 can correspond to the disposition of electrode pads of semiconductor chips provided arbitrarily on a wafer; probers 294 are formed corresponding to the electrode pads of semiconductor chips 33f, 33g and 33h having different shapes with each other. The constitution of probers as mentioned in the above is efficacious for the wafer tests of LSI's produced in small quantity and many kinds. FIG. 8 shows such a wafer in which several types of semiconductor chips are provided.

Now, a manufacturing method for a probe card shown in FIG. 3 will be described. As an example, a case where photosensitive glass is used as a material for a probe card is explained in the following.

Figure 9A:
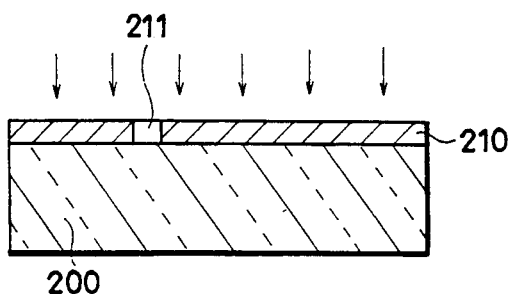
FIG. 9A to FIG. 9G are cross-sectional views showing a manufacturing method in the order of manufacturing process of a probe card according to the present invention.

Referring to FIG. 9A, a mask 210 is formed on a photosensitive glass 200 of which both side surfaces are polished. The mask 210 has a region 211 which passes ultraviolet rays. With the use of the mask 210 the sensitive glass 200 is exposure-processed by the irradiation of ultraviolet ray from the direction shown with an arrow mark.

Figure 9B:
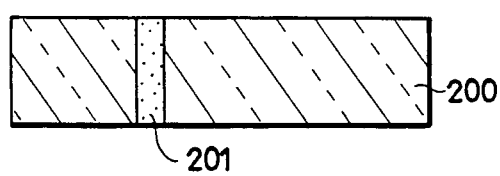

Referring to FIG. 9B, the region where a latent image is formed on the photosensitive glass 200, that is an exposed part, is crystallized with a specified heat treatment. The photosensitive glass is sensitized with ultraviolet rays, and metallic colloid is generated by a heat-development process after exposure, and further crystal is created making the colloid nuclei. Thus a crystallized part 201 is created in the exposed part on the sensitive glass 200. The crystallized part has minute structure and has the capability of being soluble in acid.

Figure 9C:
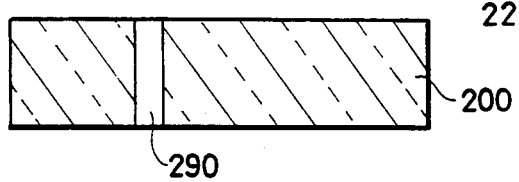

Furthermore, the crystallized part 201 is etched as shown in FIG. 9C, and thus through holes 290 are formed.

Figure 9D:
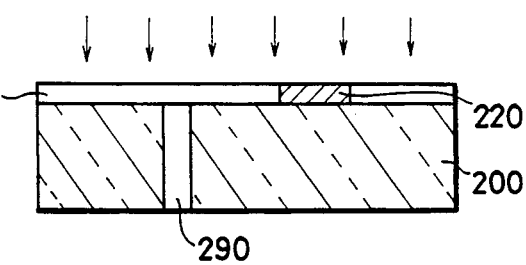

As shown in FIG. 9D, mask 220 having a part 221 through which ultraviolet rays can pass is formed on a photosensitive glass 200. With the use of the mask 220 the photosensitive glass 200 is exposed with the irradiation of ultraviolet rays in the direction shown with an arrow mark.

Figure 9E:
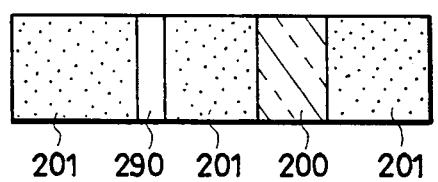

As shown in FIG. 9E, only the sensitized part, that is the part where a latent image is formed, becomes a crystallized part 201 by undergoing a specified developing process.

Figure 9F:
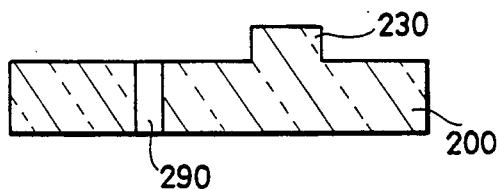

As shown in FIG. 9F, the crystallized part 201 is etched with acid. In this step, the removal depth is adjusted by adjusting the etching time, and the level-difference parts are thus selectively formed. In this way, a probe card 2 having protruding parts 230 is formed.

Figure 9G:
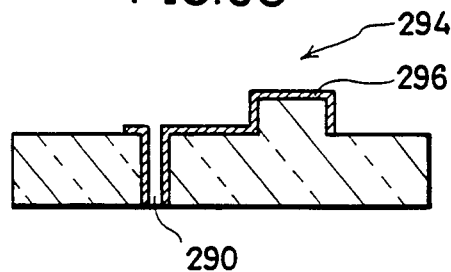
Figure 10A:
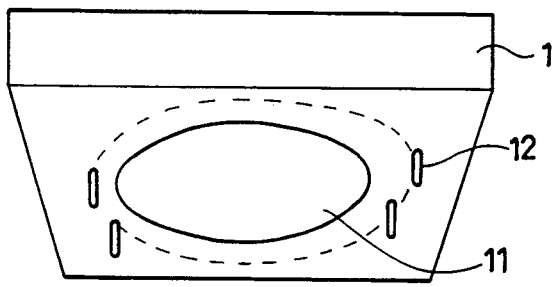
FIG. 10A to FIG. 10C are perspective views of a wafer prober as the background art disassembled for better understanding.
Figure 10B:
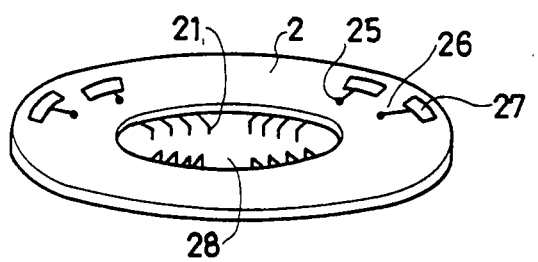
Figure 10C:
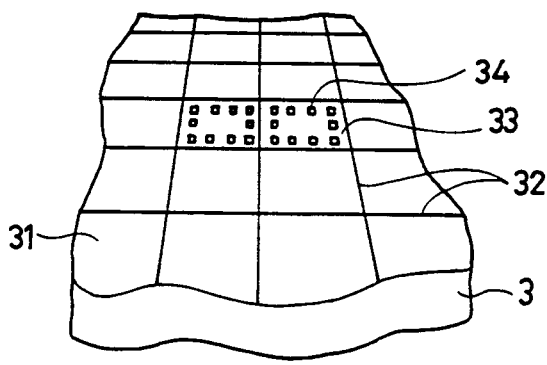
Figure 13:
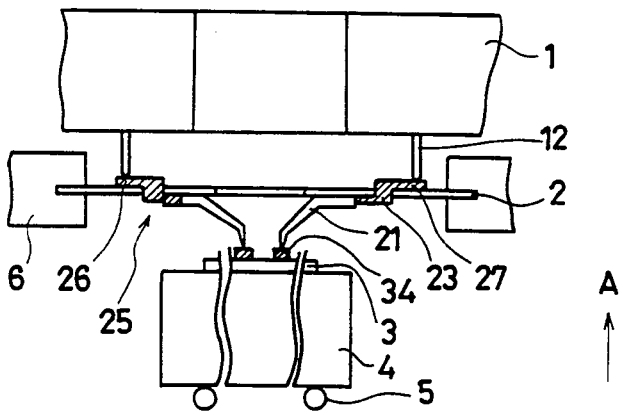
FIG. 13 is a cross-sectional view showing a using condition of wafer prober as the background art.
Figure 11:
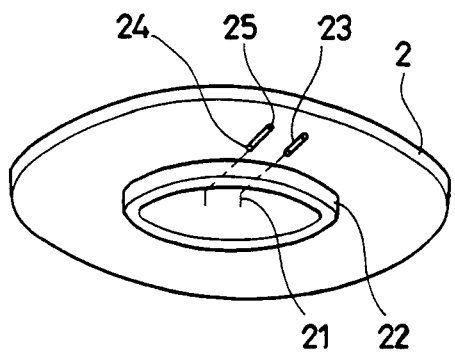
FIG. 11 is a perspective view showing the external apperance of a probe card as the background art viewed from the bottom.
Figure 12:
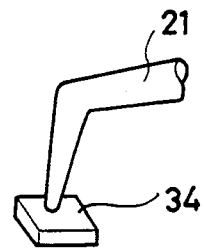
FIG. 12 is a partly enlarged perspective view showing the state where a thin long conductive needle as the background art is touching an electrode pad on the wafer.
Figure 14:
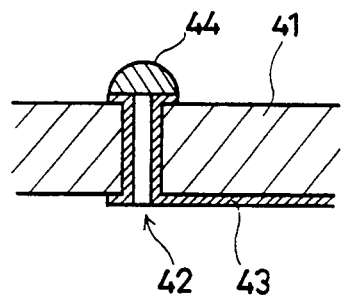
FIG. 14 is a cross-sectional view showing a conductive prober as the background art.

As shown in FIG. 9G, a metallic film 296 is attached by electroless deposition of, for example, nickel on the surface of the probe card 2. In the next step, it is patterned to obtain the probe card 2 as shown in FIG. 3.

In this manner, a probe plate and a semiconductor test apparatus using the probe plate are obtained in which the test apparatus can test, wafer by wafer, a semiconductor device, and which have the contact parts capable of being aligned precisely for a lot of electrode pads being formed with minute processing and having an arbitrarily designed pad layout on a wafer and being easy to manufacture.

In this disclosure, there are shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A test apparatus for a semiconductor device for testing a semiconductor device having electrode pads formed on a semiconductor wafer, the test apparatus comprising:
    a tester for testing said semiconductor device;
    a prober plate, comprising a base plate having a main surface and having portions homogenous with the base plate protruding from said main surface in a disposition corresponding to said electrode pads of said semiconductor wafer in said main surface and conductive probers formed on the surface of said protruding portions to serve as contact parts with said electrode pads; and
    switching means, connected to said tester and to each of said probers for switching said probers electrically to select one of said probers to be connected to said tester.

2. A test apparatus for a semiconductor device according to claim 1, wherein:
    said switching means is able to connect electrically a prober corresponding to an electrode pad of a semiconductor device on said wafer with a prober corresponding to an electrode pad of another semiconductor device on said wafer,
    whereby, said test apparatus for semiconductor device is able to test compound characteristics of a plurality of semiconductor devices.

3. A probe plate used for testing a semiconductor device having electrode pads formed on a semiconductor wafer, comprising:
    an electrically insulating base plate, having first and second main surfaces, having portions homogenous with the base plate and protruding from said first main surface in a disposition corresponding to said electrode pads on said semiconductor wafer and having through holes piercing through said first and said second main surfaces provided in the vicinity of said protruding parts;
    conductive layer parts formed on respective surfaces of said protruding portions on said base plate to serve as contact parts for making contact with said electrode pads; and
    a wiring layer formed on said second main surface of said base plate, said wiring layer being selectively connected to said conductive layer parts through said through holes of said base plate.

4. A probe plate according to claim 3, wherein: said base plate is photo-transmitting.

5. A probe plate according to claim 3, wherein:
    said protruding parts on said base plate are formed by selectively removing from said base plate material thereof in parts which do not correspond to said electrode pads.

6. A probe plate according to claim 3, wherein:
    said protruding parts are formed to have a height greater than a height of said electrode pads of said semiconductor device.

7. A probe plate according to claim 3, further comprising:
    a connecting conductive layer formed on said first main surface of said base plate for electrically connecting said contact parts with said electrode pads of a semiconductor device on said semiconductor wafer and said contact parts with said electrode pads of another semiconductor device on said semiconductor wafer.

* * * * *